United States Patent
Bucklen

(10) Patent No.: US 7,382,298 B1
(45) Date of Patent: Jun. 3, 2008

(54) CODE-CORRECTION STRUCTURES AND METHODS FOR DIGITAL DISPLAYS

(75) Inventor: Willard Kraig Bucklen, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/654,759

(22) Filed: Jan. 17, 2007

(51) Int. Cl.
*H03M 1/06* (2006.01)

(52) U.S. Cl. .................. 341/118; 341/120; 341/155; 348/572

(58) Field of Classification Search ............. 341/118, 341/120, 155; 348/572
See application file for complete search history.

(56) References Cited

U.S. PATENT DOCUMENTS

| | | | | |
|---|---|---|---|---|
| 4,947,168 | A * | 8/1990 | Myers ..................... | 341/120 |
| 5,841,430 | A * | 11/1998 | Kurikko ................... | 345/213 |
| 5,874,909 | A | 2/1999 | Soenen et al. ............ | 341/141 |
| 6,057,891 | A * | 5/2000 | Guerin et al. ............ | 348/572 |
| 6,151,007 | A | 11/2000 | Kasai et al. ............. | 345/95 |
| 6,191,823 | B1 | 2/2001 | Ahn ........................ | 348/554 |
| 6,226,040 | B1 | 5/2001 | Kuo et al. ............... | 348/446 |
| 6,275,259 | B1 | 8/2001 | Gowda et al. ........... | 348/229 |
| 6,285,344 | B1 | 9/2001 | Everard et al. .......... | 345/3 |
| 6,310,597 | B1 * | 10/2001 | Kim ........................ | 345/98 |
| 6,490,005 | B1 * | 12/2002 | Steinbach et al. ........ | 348/572 |
| 6,529,211 | B2 | 3/2003 | Ohara et al. ............. | 345/690 |
| 7,106,231 | B2 * | 9/2006 | Smith et al. ............. | 341/120 |
| 7,154,495 | B1 * | 12/2006 | Bucklen ................... | 345/213 |
| 7,307,562 | B2 * | 12/2007 | Bucklen ................... | 341/123 |

* cited by examiner

*Primary Examiner*—Khai M Nguyen
(74) *Attorney, Agent, or Firm*—Koppel, Patrick, Heybl & Dawson

(57) ABSTRACT

Analog-to-digital converters (ADCs) generally make code errors as they convert analog display signals to digital display signals of digital displays. Code-correction structures are provided that correct these code errors by initially configuring the ADCs to provide digital signals with redundant resolution. In particular, analog display signal having $2^N$ discrete analog levels are converted with M-bit ADCs wherein M exceeds N. This redundancy is utilized with a controller that distinguishes differences between an occurrence pattern of digital codes and a desired error-free pattern of digital codes. Subsequently, the controller corrects the digital code to reduce the observed differences.

24 Claims, 7 Drawing Sheets

US 7,382,298 B1

CODE-CORRECTION STRUCTURES AND METHODS FOR DIGITAL DISPLAYS

BACKGROUND OF THE INVENTION

1. Field of the Invention

The present invention relates generally to digital displays and, more particularly, to display interfaces that adapt analog display signals to digital displays.

2. Description of the Related Art

The cathode ray tube (CRT) has been the standard computer-display monitor for many years. Because CRTs have generally responded to analog display signals, there currently exists a huge installed base of computers (more than a billion) that incorporate digital-to-analog converters (DACs) which are configured to generate CRT analog display signals.

Recently, digital display devices (e.g., flat-panel displays, liquid crystal displays, projectors, digital television displays and near-to-eye displays) have become increasingly popular. Although it is anticipated that all-digital interfaces will eventually become the standard interface for these displays, analog interfaces must be available for the near future because of the large existing installation base of computers.

In response to the need for both analog and digital interfaces, an open industry group known as the Digital-Display Working Group (DDWG) has developed a digital-visual interface (DVI) specification which establishes analog and digital interface standards. In particular, these standards reference the Video Electronics Standards Association (VESA) specifications for the implementation of analog interfaces.

Analog-to-digital converters (ADCs) are typically used to adapt the analog display signals to a digital display. Because these converters are generally prone to make conversion errors (e.g., offset and gain errors), the generated digital display signal often includes errors which degrade image parameters (e.g., brightness and contrast in primary colors) of the digital display.

BRIEF SUMMARY OF THE INVENTION

The present invention is directed to code-correction structures and methods that reduce conversion errors between associated digital-to-analog and analog-to-digital converters. In this reduction, the analog-to-digital converters are configured to provide redundant resolution. This redundancy is then utilized by distinguishing and correcting differences between an occurrence pattern of digital codes and a desired error-free pattern of digital codes The novel features of the invention are set forth with particularity in the appended claims. The invention will be best understood from the following description when read in conjunction with the accompanying drawings.

DETAILED DESCRIPTION OF THE INVENTION

Figure 1:
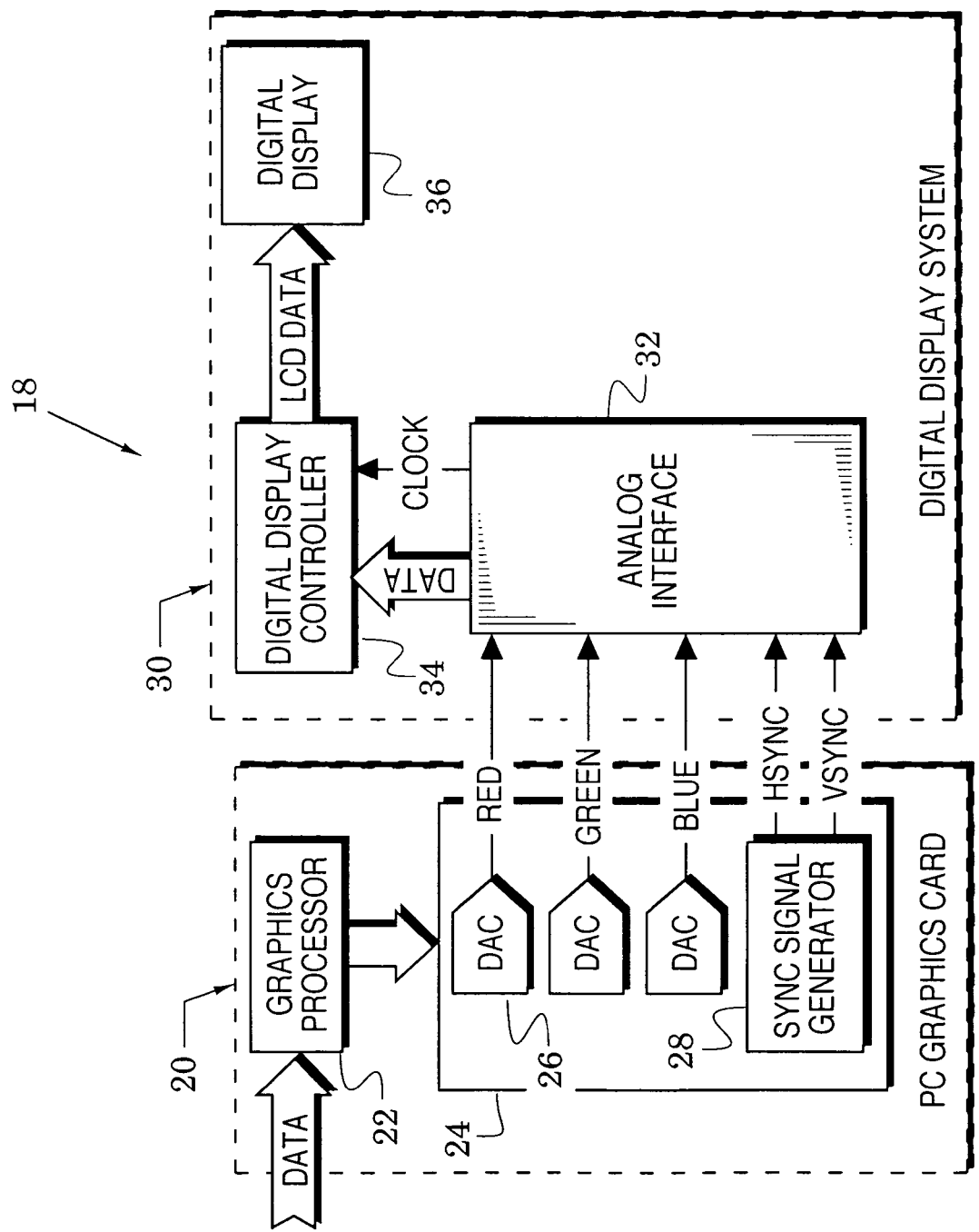
FIG. 1 is a block diagram of a data processing and display system embodiment of the present invention.
Figure 2:
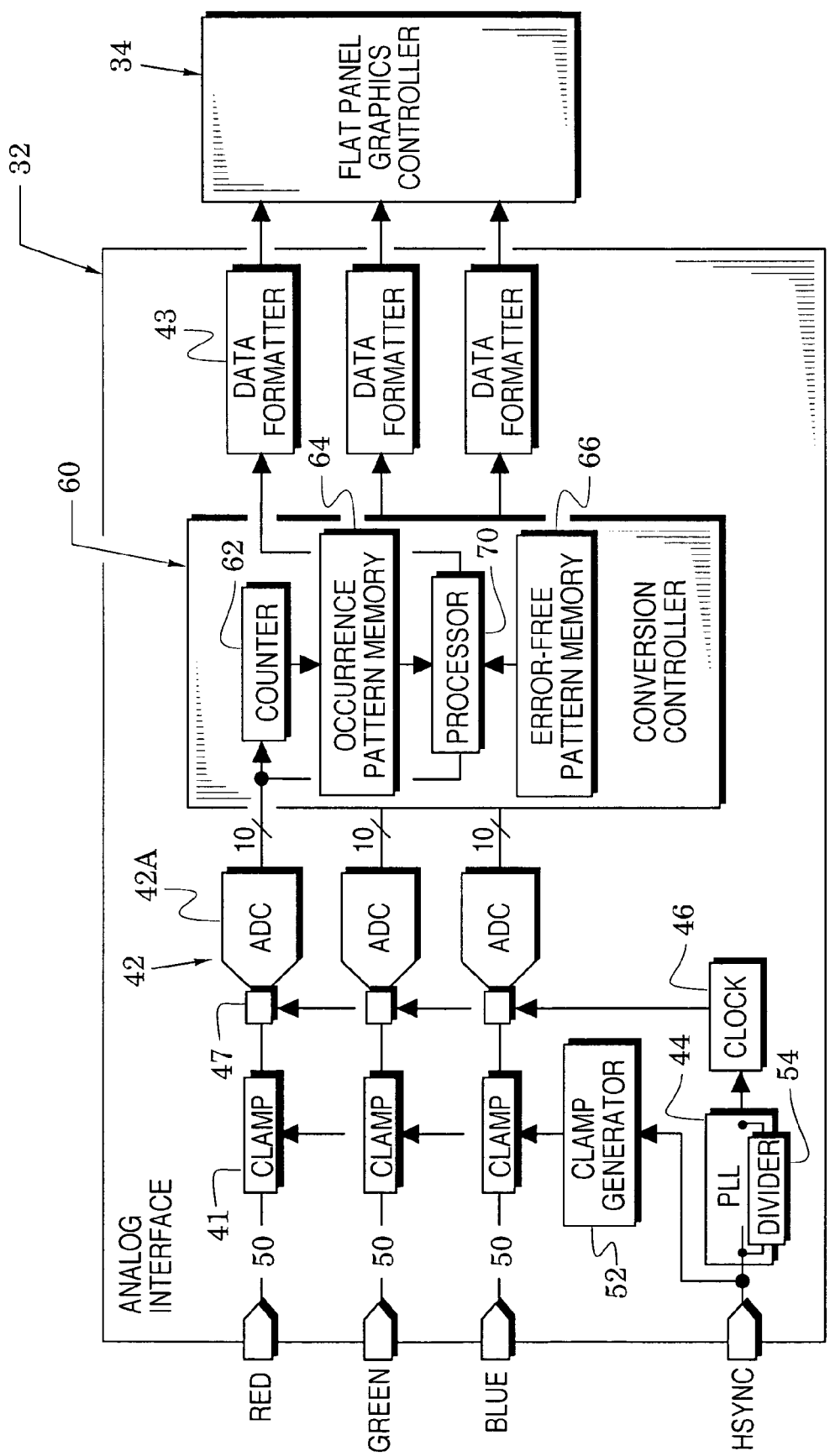
FIG. 2 is a block diagram of an analog interface embodiment in the system of FIG. 1.
Figure 3:
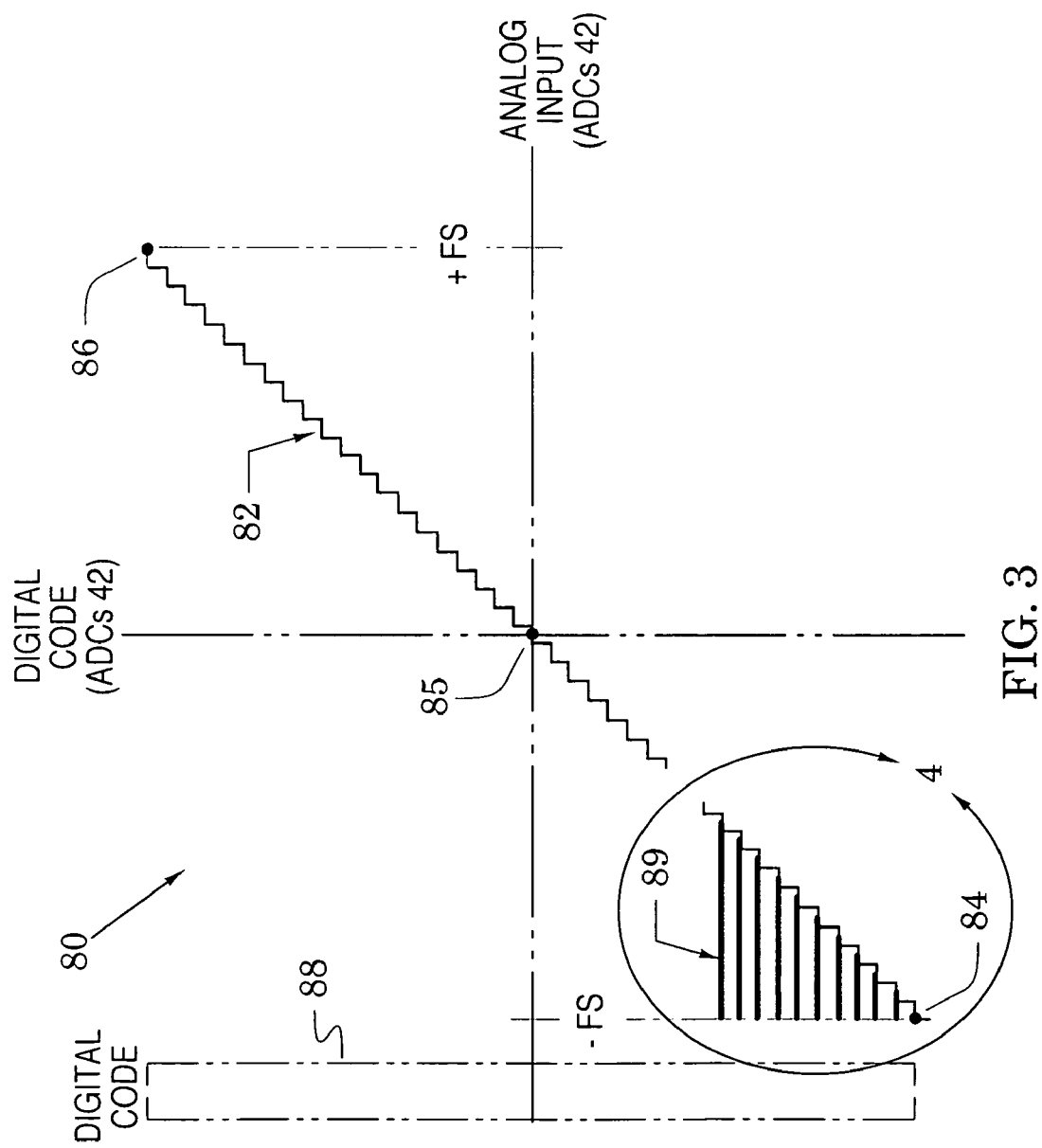
FIG. 3 is a diagram of a transfer function of analog-to-digital converters in the analog interface of FIG. 2.
Figure 4:
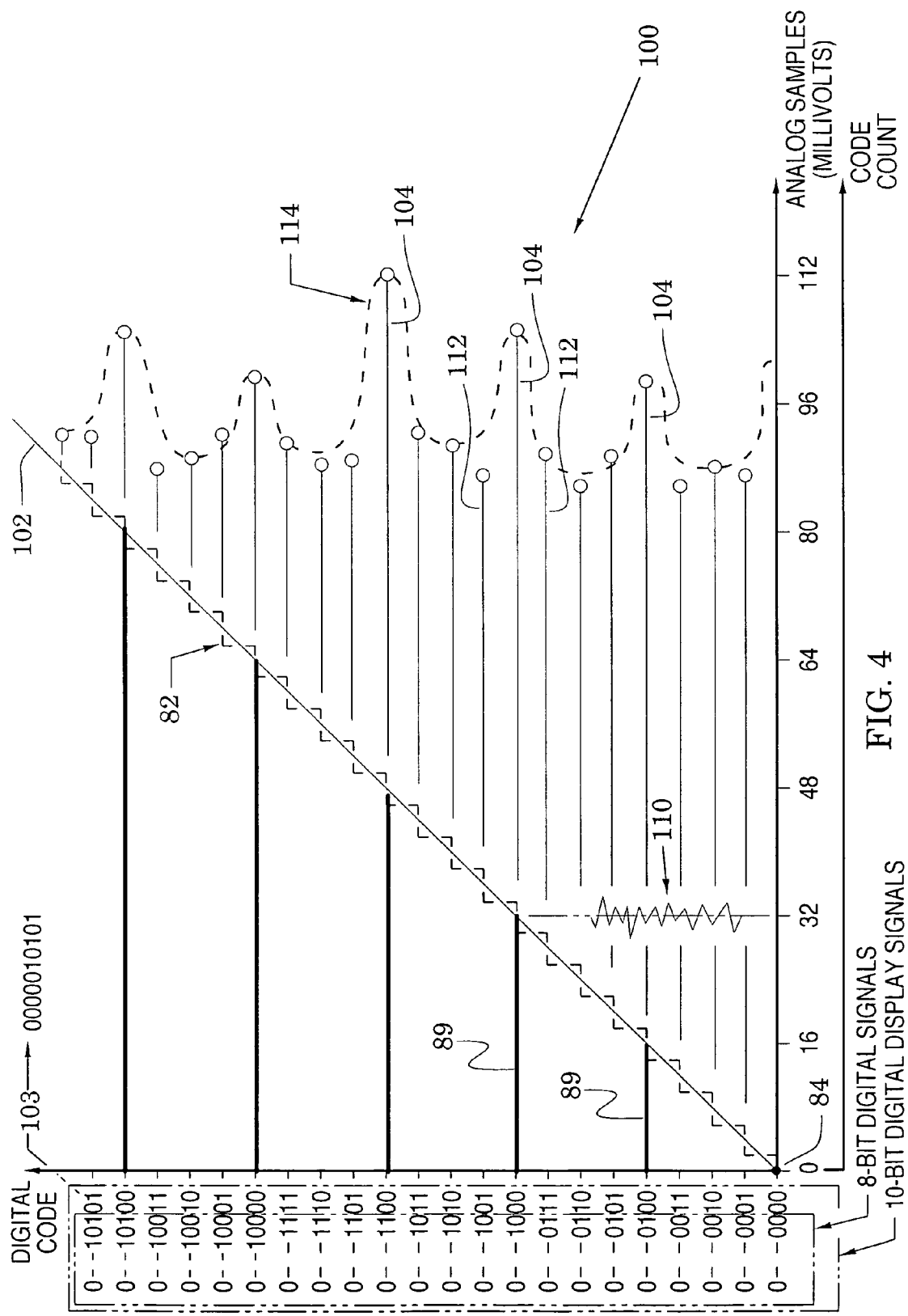
FIG. 4 is an enlarged view of the diagram within the curved circle 4 of FIG. 3 which illustrates code counts in a conversion controller of FIG. 2.

FIGS. 1 through 6 illustrate structures and methods of the invention for correcting code errors in digital display signals. FIG. 1 is a block diagram of a data processing and display system which includes digital-to-analog converters (DACs) that provide analog signals with $2^N$ analog levels. FIG. 2 is a block diagram of an analog interface which includes a conversion controller that effects the code-error correction. FIG. 3 illustrates a transfer function of M-bit analog-to-digital converters (ADCs) in the analog interface. FIG. 4 is an enlargement of one portion of FIG. 3 and FIGS. 5A and 5B are similar to FIG. 4 but show error correction methods of the invention which are summarized in a flow chart of FIG. 6.

Because the ADCs inevitably generate code errors that degrade the display quality, the present invention configures them and the conversion controller to effectively correct these code errors. An investigation of this configuration is facilitated by preceding it with the following description of elements of FIGS. 1 and 2.

In particular, FIG. 1 illustrates a data processing and display system 18 which couples display signals from a pc graphics card 20 to a digital display system 30. The graphics card 20 includes a graphics processor 22 and a signal converter 24. The signal converter comprises a set of DACs 26 and a sync signal generator 28.

In operation of the graphics card 20, the graphics processor 22 converts data from a computer's central processing unit (not shown) into a graphics-oriented format. The DACs 26 then convert elements of the formatted data into analog display signals that each contain analog information (coded in $2^N$ analog levels) sufficient to generate one of the red, green and blue components that form an analog image (e.g., on a CRT).

The sync signal generator 28 also responds to elements of the formatted data by generating synchronization signals that define spatial order for the analog display signals (i.e., the spatial order of display pixels). For example, these synchronization signals typically comprise a horizontal synchronization signal (hsync) that indicates the beginning of each display line and a vertical synchronization signal (vsync) that indicates the beginning of each frame of horizontal lines.

The digital display system 30 includes an analog interface 32, a digital display controller 34 and a digital display 36 which may be, for example, a liquid crystal display panel. In operation, the analog interface receives the red, green and blue analog display signals and their corresponding synchronization signals from the pc graphics card 20 and converts them to digital display signals and a corresponding clock signal. The digital display controller 34 receives these signals from the analog interface and formats them into forms suitable for display of the graphics data on the digital display 36.

FIG. 2 shows that the analog interface 32 includes, for each of the red, green and blue analog display signals, an ADC 42 that is coupled between a signal clamp 41 and a data formatter 43. It further includes a phase-locked loop (PLL) 44 and a sample clock 46 which drives wide-band samplers 47 in each of the ADCs 42. In response to the red, green and blue analog display signals 50 and to the sample clock 46, the samplers provide analog samples which are then quantized by the converter portions of the ADCs 42. The data formatters 43 convert the quantized signals into formats compatible with the digital display controller 34.

In order to set the black level of the ADCs properly, a clamp generator 52 provides information as to the location of the "back porch" which is located between each hsync signal and the first pixel of the line. At this point, a clamp generator commands the clamps 41 to establish a predetermined clamp level (e.g., 0 volts) for each ADC.

The PLL 44 provides a reference signal which it phase locks to the hsync signal that comes from the sync signal generator (28 in FIG. 1). It is intended that graphics will be displayed on the digital display (36 in FIG. 1) in a predetermined number of pixels (e.g., 1280) that are spaced across a predetermined number of lines (e.g., 1024) that form one complete graphics frame. Accordingly, the PLL 44 includes a divider 54 that divides the reference signal so that it can be phase locked to the hsync signal.

In modern data processing environments, the ADCs operate in the presence of a number of disturbance parameters (e.g., wide temperature ranges, voltage supply variations, and the presence of noise signals). Accordingly, their signal conversion is generally less than perfect so that they generate code errors (e.g., missing codes and incorrect codes). These code errors degrade the quality of the image produced on a digital display (36 in FIG. 1). Rather than correcting these code errors, typical display systems provide display gain and offset controls. Although these controls reduce the display degradation, the lost data causes the quality of the display image to be generally less than desired.

The present invention recognizes that correction of these code errors can be facilitated by configuring the ADCs to provide digital signals with redundant resolution. The invention further recognizes that appropriate observation of this redundancy can distinguish differences between an occurrence pattern of digital codes and a desired error-free pattern. In response to these differences, a conversion controller can substantially correct the digital code.

The ADCs 42 of FIG. 2 receive the analog signals 50 which comprise $2^N$ analog levels. In accordance with the above-noted recognitions, these ADCs are configured as M-bit ADCs wherein M exceeds N. In addition, a conversion controller 60 is inserted between the ADCs 42 and their respective data formatters 43. The controller includes a counter 62, an occurrence pattern memory 64, an error-free pattern memory 66 and a processor 70 (although these components are inserted to correct errors of each of the ADCs, their operation will be subsequently described with reference to only an exemplary ADC 42A to thereby simplify the description).

The counter 62 monitors the output of the ADC 42A and provides code counts to the occurrence pattern memory. The processor receives inputs from the occurrence pattern memory and the error-free pattern memory and is coupled to correct the ADC digital signals and pass them to the respective data formatter 43.

The operation of the conversion controller can be described with aid of the graph 80 of FIG. 3 which shows a transfer function 82 of the ADC 42A of FIG. 2 wherein the transfer function indicates the output digital code that corresponds to the analog input of the ADC. For illustrative purposes, the ADC is assumed to respond to bipolar analog input signals so that the transfer function passes through a zero point 83 and terminates in negative and positive full-scale points 84 and 86.

FIG. 3 also provides a digital-code table 88 which lists the M-bit output digital codes of the ADC 42A. The table also lists the N-bit input digital codes of the DACs 26 of FIG. 1 and heavy horizontal bars 89 represent analog signals that correspond to these N-bit codes. This graph structure is more easily seen in the graph 100 of FIG. 4 which is an enlargement of the portion of FIG. 3 that is within the curved line 4.

The graph 100 corresponds to a system embodiment in which N is eight and M is ten. The digital-code table 88 therefore indicates eight-bit words which correspond to the digital data that is provided to the DACs 26 in FIG. 1. For example, the digital code 0---00 represents the least of the eight-bit words and digital codes 0---01, 0---10, 0---11, 0---100 and so on represent the next successive eight-bit words The heavy horizontal bars 89 indicate analog values that the DACs generate in response to the digital data. For example, they indicate 16, 32, 48 and 64 millivolts in response to the respective input codes 0---01, 0---10, 0---11, and 0---100.

The horizontal axis of the graph 100 is also used to indicate the amplitude of analog samples produced by the wide-band samplers 47 of FIG. 2. Just as the horizontal bars 89 of FIG. 4 indicate conversion performance of the DACs 26 of FIG. 1, the transfer function 82 indicates conversion performance of the ADC 42A with respect to these analog samples.

Ten-bit words in the digital code table 88 correspond to the output digital codes of the ADC 42A in response to the analog display signals 50. The transfer function 82 is centered on a linear graph line 102 so that it corresponds to a case in which the ADC 42A has a perfect linear response with an absence of offset and gain errors. The 16, 32, 48 and 64 millivolts analog signals (provided by the DACs of FIG. 1 in response to the respective eight-bit codes 0---0100, 0---1000, 0---1100 and 0---10000) would therefore cause the ADCs 42 of FIG. 2 to generate the respective ten-bit codes of 0---0100, 0---1000, 0---1100 and 0---10000 (all codes are shortened in FIG. 4 to conserve space—a full ten-bit code is indicated at the top of the code table 88 by indication arrow 103).

In response to these ten-bit codes, the counter 62 will produce respective code counts which can be stored in respective code bins of the occurrence memory 64. The extent of these code counts are shown by horizontal lines 104 (each terminated by an open circle) in FIG. 4 wherein the horizontal axis of the graph 100 also represents code counts. Over a selected time span, it is assumed that each of the code bins will accumulate a substantial but different code count (wherein it is assumed that the data in FIG. 1 will output all digital codes over the selected time span).

In a real display system, the analog display signals will include spurious signals because of various perturbations. For example, a noise signal 110 is shown in FIG. 4 to be superimposed on the 32 millivolt response of one of the DACs 26 of FIG. 1 so that the ADC 42A in FIG. 2 also generates ten-bit codes of 0---0111 and 0---0101 in addition to the desired ten-bit code of 0---1000. In the presence of typical noise levels, however, the code count in the code bins corresponding to these spurious signals will be substantially less than the code count in the code bin corresponding to the desired ten-bit code of 0---1000. The extents of these spurious code counts over the selected time span are therefore shown by horizontal lines 112 which are substantially shorter that their corresponding line 104.

The broken-line code-bin contour 114 thus indicates a typical limit of the various code counts in the presence of real-life noise signals and indicates general information which the occurrence pattern memory 64 of FIG. 2 provides to the processor 70 and constitutes the error-free information provided by the error-free memory 66. The processor is configured to compare these patterns and, in the situation depicted in FIG. 4, detect that the ADCs are not inserting conversion errors into the digital display signals. Accordingly, the processor would pass the signals to the data formatters 43 without alteration.

Figure 5A:
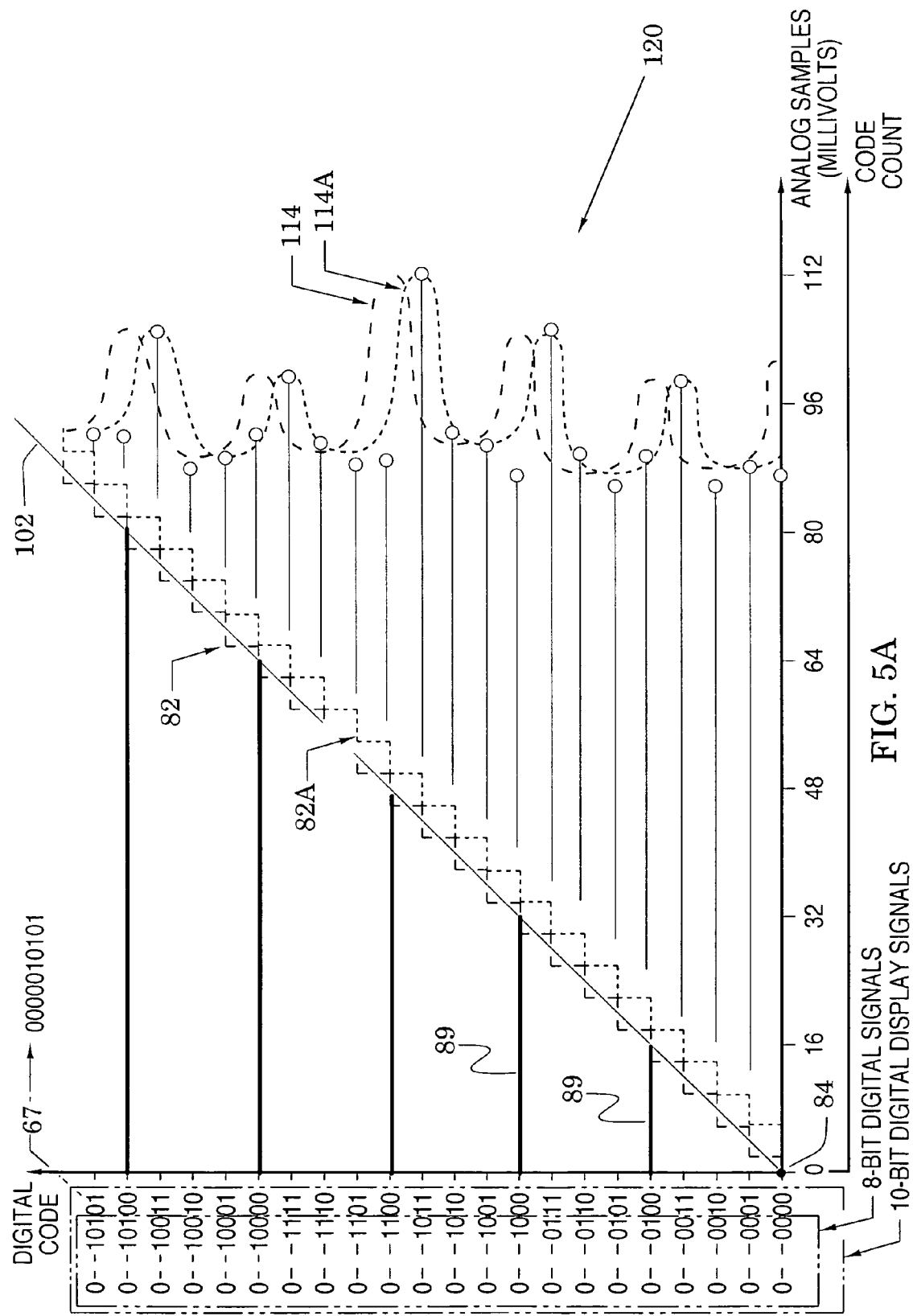
FIGS. 5A and 5B are diagrams similar to the diagram of FIG. 4 which illustrate code counts that correspond to conversion errors in analog-to-digital converters of the analog interface of FIG. 2.
Figure 5B:
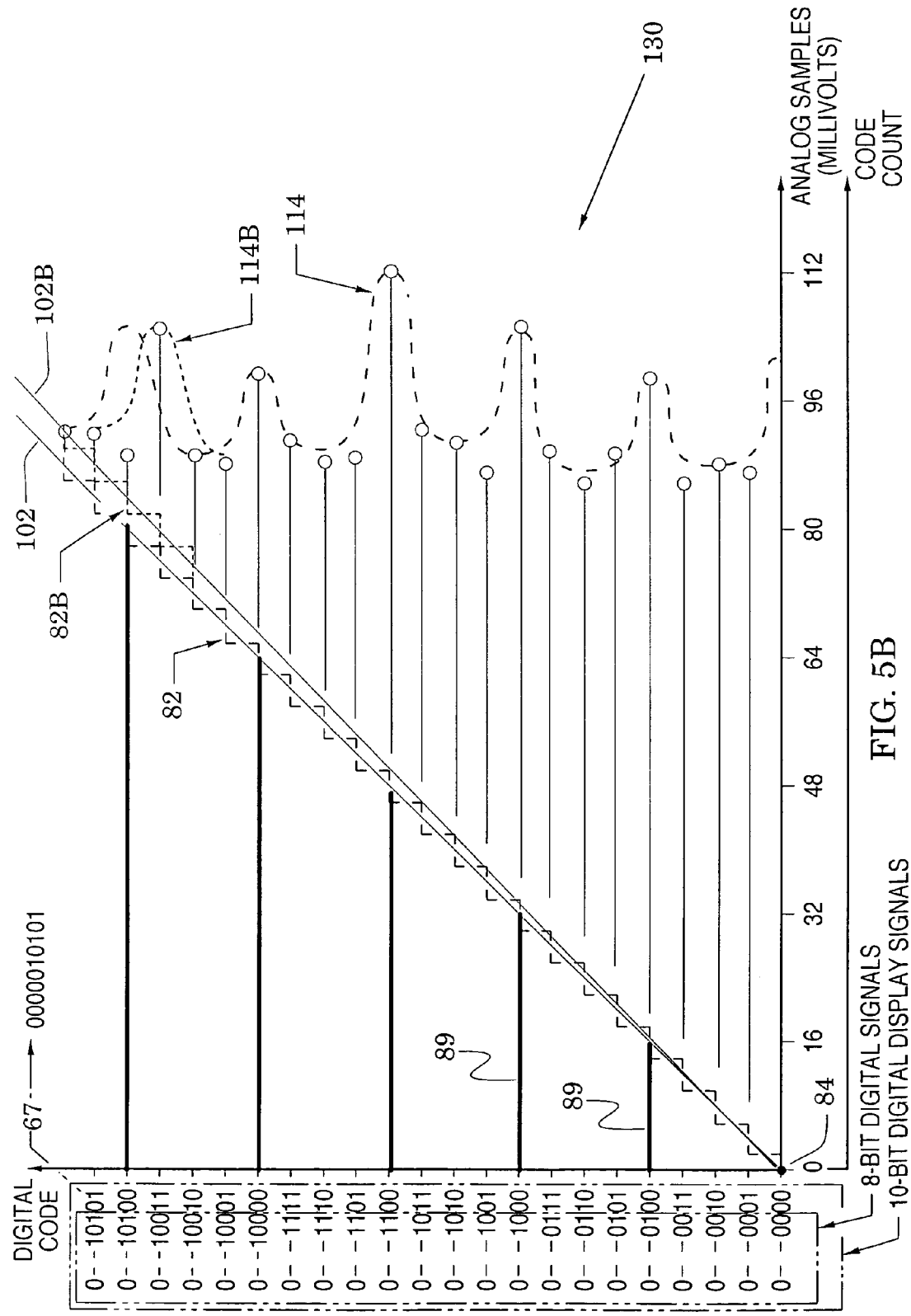
Figure 6:
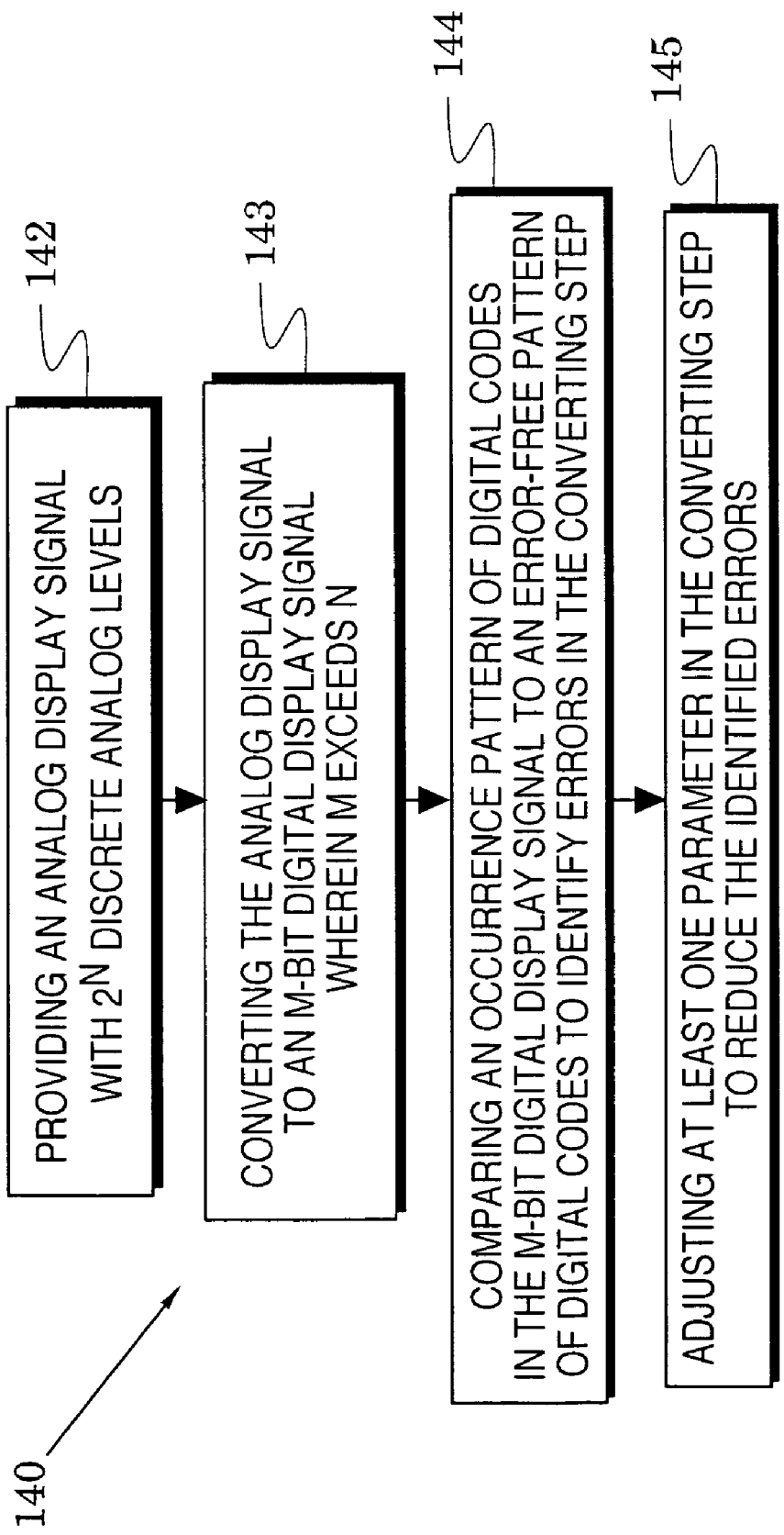
FIG. 6 is a flow chart that illustrates a method embodiment of the invention for correcting code errors in analog-to-digital converters of the analog interface of FIG. 2.

In contrast, FIGS. 5A and 5B show graphs 120 and 130 which illustrate typical ADC conversion errors and their correction by the conversion controller 60 of FIG. 2. These figures are similar to FIG. 4 with like elements indicated by like reference numbers.

In FIG. 5A, the transfer function 82 of the ADC 42A has shifted from a position about the linear graph line 102 to a position 82A. In response to this offset error, the broken-line code-bin contour 114 (introduced in FIG. 4) has shifted by one code bin to a code-bin contour 114A (indicated, for clarity, by a different broken line). The processor 70 of FIG. 2 is configured to note this shift and to insert a digital correction that corrects the code of the digital display signal that is passed on to the data formatters 43. Although the processor 70 monitors differences between the occurrence pattern in the memory 64 and the error-free pattern in the memory 66, it need only detect the difference at a selected one of the digital codes of the error-free pattern since the offset is the same at all digital codes.

In the graph 130 of FIG. 5B, the transfer function 82 of the ADC 42A has rotated so that it is centered not on the linear graph line 102 but rather on a tilted graph line 102B. For simplicity of illustration, the corresponding transfer function 82B is only shown where it has been altered by one digital code from the error-free transfer function 82.

In response to this gain error, the broken-line code-bin contour 114 has shifted locally by one code bin to a code-bin contour 114B but has not shifted at the negative full-scale point 84. The processor 70 of FIG. 2 is configured to note this shift and to insert a digital correction that corrects the code of the digital display signal that is passed on to the data formatters 43.

For this gain error, the processor needs to detect an occurrence pattern difference at a selected pair of digital codes of the error-free pattern. For example, the processor could monitor the difference (zero) at the negative full-scale point 84 (introduced in FIG. 3) and at the eight-bit digital code 0---101). From these differences, the processor calculates the gain error and inserts a corresponding digital correction into the code of the digital display signal.

Different embodiments of the conversion controller (60 in FIG. 2) can be configured to correct conversion errors in a variety of methods. For example, the controller can initially observe and correct pattern differences at the transfer function's zero point (85 in FIG. 3) to remove an ADC offset error and then observe pattern differences at two points of the transfer function to detect and correct an ADC gain error.

In a second example, the controller can initially observe and correct pattern differences at the transfer function's negative full-scale point (84 in FIG. 3) to remove an ADC offset error and then observe pattern differences at two points of the transfer function to detect and correct an ADC gain error. Because the latter correction may leave an offset error, these operations are preferably repeated as needed.

The operation of the conversion controller (60 in FIG. 2) is summarized in the flow chart 140 of FIG. 7. After an analog display signal with $2^N$ discrete analog levels has been provided in process step 142 of the flow chart, it is converted in process step 144 to an M-bit digital display signal wherein M exceeds N.

An occurrence pattern of digital codes in the M-bit digital display signal is then compared to an error-free pattern of said digital codes to identify errors in the converting step. Finally, at least one parameter (e.g., an offset parameter or a gain parameter) is adjusted in the converting step to reduce the errors.

The present invention recognizes that correction of these code errors can be facilitated by configuring the ADCs to provide digital signals with redundant resolution which is provided by converting an analog display signal having $2^N$ discrete analog levels with M-bit ADCs wherein M exceeds N.

This redundancy is then utilized with a controller that distinguishes differences between an occurrence pattern of digital codes and a desired error-free pattern of digital codes. Subsequently, the controller corrects the digital code to reduce the observed differences. In an embodiment, the controller is formed with memories and a processor which can be realized with an appropriately-programmed digital processor, an array of gates or combinations thereof.

For exemplary purposes, the invention has been described with reference to an ADC 42A in FIG. 2 that converts a red analog display signal. The other analog display signals can be similarly corrected.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A method of correcting code errors in a digital display signal, comprising the steps of:
   converting an analog display signal that has $2^N$ discrete analog levels to an M-bit digital display signal wherein M and N are nonzero integers and M exceeds N;
   comparing an occurrence pattern of digital codes in said M-bit digital display signal to an error-free pattern of said digital codes to identify errors in said converting step; and
   adjusting at least one parameter in said converting step to reduce said errors.

2. The method of claim 1, wherein M exceeds N by at least 2.

3. The method of claim 1, further including the step of forming said error-free pattern from the digital codes of said M-bit digital display signal.

4. The method of claim 1, wherein said parameter is conversion offset.

5. The method of claim 1, wherein said parameter is conversion gain.

6. The method of claim 1, wherein said comparing step includes the step of counting occurrences of said digital codes over predetermined time periods to determine said occurrence pattern.

7. The method of claim 1, wherein said adjusting step includes the step of inserting an offset correction in said M-bit digital display signal.

8. The method of claim 1, wherein said adjusting step includes the step of inserting a gain correction in said M-bit digital display signal.

9. The method of claim 1, wherein:
said comparing step includes the step of noting a difference between said occurrence pattern and said error-free pattern that corresponds to a selected digital code of said error-free pattern; and
said adjusting step includes the step of inserting an offset correction in said M-bit digital display signal to reduce said difference.

10. The method of claim 1, wherein:
said comparing step includes the step of noting first and second differences between said occurrence pattern and said error-free pattern that correspond to first and second selected digital codes of said error-free pattern; and
said adjusting step includes the step of inserting a gain correction in said M-bit digital display signal to substantially equalize said first and second differences.

11. An analog interface which generates a digital display signal from an analog display signal that is limited to $2^N$ discrete analog levels, the interface comprising:
an analog-to-digital converter that converts said analog display signal to an M-bit digital display signal wherein M and N are nonzero integers and M exceeds N; and
a conversion controller configured to compare an occurrence pattern of digital codes in said M-bit digital display signal to an error-free pattern of said digital codes to identify and correct conversion errors in said M-bit digital display signal.

12. The interface of claim 11, wherein said controller includes:
a counter that counts occurrences of digital codes in said M-bit digital display signal to thereby form said occurrence pattern; and
a memory that stores at least one of said occurrence pattern and said error-free pattern.

13. The interface of claim 12, wherein said controller further includes a processor that corrects conversion errors in said M-bit digital display signal in response to the occurrence pattern of said memory.

14. The interface of claim 11, wherein said controller includes:
a counter that counts occurrences of digital codes in said M-bit digital display signal to thereby form said occurrence pattern;
a memory that responds to said counter and stores at least one of said occurrence pattern and said error-free pattern; and
a processor configured to correct conversion errors in said M-bit digital display signal in response to said occurrence pattern of said memory.

15. The interface of claim 14, wherein said processor is configured to:
compare at least a portion of said occurrence pattern and said error-free pattern to identify a selected one of said conversion errors; and
substantially correct said selected conversion error to thereby provide a corrected digital display signal.

16. The interface of claim 15, wherein said selected conversion error is an offset conversion error.

17. The interface of claim 15, wherein said processor is configured to compare at least two portions of said occurrence pattern wherein said selected conversion error is a gain conversion error.

18. The interface of claim 15, wherein said processor includes at least one of a digital processor and an array of gates.

19. A data processing and display system, comprising:
a data-generation device that generates data and which includes an N-bit digital-to-analog converter that provides an analog display signal with $2^N$ discrete analog levels that correspond to said data;
a digital display which includes an M-bit analog-to-digital converter that converts said analog display signal to an M-bit digital display signal wherein M and N are nonzero integers and M exceeds N and wherein said digital display is responsive to said digital display signal; and
a conversion controller configured to compare an occurrence pattern of digital codes in said M-bit digital display signal to an error-free pattern of said digital codes to identify and correct conversion errors in said M-bit digital display signal.

20. The system of claim 19, wherein said controller includes:
a counter that counts occurrences of digital codes in said M-bit digital display signal to thereby form said occurrence pattern;
a memory that responds to said counter and stores at least one of said occurrence pattern and said error-free pattern; and
a processor configured to correct conversion errors in said M-bit digital display signal in response to said occurrence pattern of said memory.

21. The system of claim 20, wherein said processor is configured to:
compare at least a portion of said occurrence pattern and said error-free pattern to identify a selected one of said conversion errors; and
substantially correct said selected conversion error to thereby provide a corrected digital display signal.

22. The system of claim 21, wherein said selected conversion error is an offset conversion error.

23. The system of claim 21, wherein said processor is configured to compare at least two portions of said occurrence pattern wherein said selected conversion error is a gain conversion error.

24. The system of claim 21, wherein said processor includes at least one of a digital processor and an array of gates.

* * * * *